United States Patent [19]
Karlquist

[11] Patent Number: 5,708,394
[45] Date of Patent: Jan. 13, 1998

[54] BRIDGE-STABILIZED OSCILLATOR CIRCUIT AND METHOD

[75] Inventor: Richard K. Karlquist, Cupertino, Calif.

[73] Assignee: Hewlett-Packard Company, Palo Alto, Calif.

[21] Appl. No.: 671,300

[22] Filed: Jul. 1, 1996

[51] Int. Cl.⁶ .................... H03B 5/32; H03L 7/02
[52] U.S. Cl. ............ 331/1 R; 331/116 R; 331/139; 331/158; 331/177 V; 331/183
[58] Field of Search ................ 331/1 R, 116 R, 331/116 FE, 158, 139, 177 V, 183

[56] References Cited

U.S. PATENT DOCUMENTS

| | | | |
|---|---|---|---|
| 4,155,257 | 5/1979 | Wittke | 73/497 |
| 4,283,691 | 8/1981 | Burgoon | 331/158 |
| 4,358,742 | 11/1982 | Ferriss | 331/158 |
| 4,518,930 | 5/1985 | Rozema et al. | 331/177 V |

OTHER PUBLICATIONS

L. A. Meacham, "Bridge-Stabilized Oscillator," Proceedings of the IRE, 26 (10), pp. 1278–1294, no date.

A. Benjaminson, "A Crystal Oscillator With Bidirectional Frequency Control and Feedback ALC," in Proceedings of the 40th Annual Symposium on Frequency Control, 1986, pp. 344–349 no month.

R. Karlquist, "A Narrow Band High-Resolution Synthesizer Using a Direct Digital Synthesizer followed by Repeated Dividing and Mixing," in Proceedings of the 1995 IEEE International Frequency Control Symposium, pp. 217–235, no month.

HP 10811D/10811E Crystal Oscillators Product Catalog, May 1991, pp. 1–4.

Les Hurley, "A Temperature-Controlled Crystal Oscillator," 43rd Annual Symposium on Frequency Control—1989, pp. 55–57, no month.

J. Robert Burgoon and Robert L. Wilson, "SC-Cut Quartz Oscillator Offers Improved Performance," Hewlett-Packard Journal, Mar. 1981, pp. 20–29.

John R. Vig, Raymond L. Filler and John A. Kosinski, "SC-CUT Resonators for Temperature Compensated Oscillator," Proceedings of the 36th Annual Frequency Control Symposium (1982), pp. 1–6, no month.

*Primary Examiner*—Siegfried H. Grimm

[57] ABSTRACT

An apparatus and method are disclosed for improving the stability of the frequency of vibration of an oscillator signal produced by an oscillator circuit. In a preferred embodiment of the present invention, a quartz crystal resonator is one arm of a bridge which generates a bridge signal which varies in accordance with the vibrating frequency of the resonator. A synchronous demodulator responds to the bridge signal for producing an error signal which is converted into a control signal. A control circuit receives the control signal and changes its reactance when the resonator is no longer vibrating at its unperturbed resonance frequency so that the vibration frequency of the resonator connected to the control circuit is returned to its resonant frequency. An automatic level control circuit is also included for controlling the drive level of the signal exciting the resonator.

74 Claims, 12 Drawing Sheets

BRIDGE-STABILIZED OSCILLATOR CIRCUIT AND METHOD

FIELD OF THE INVENTION

This invention relates to oscillator circuits and, more particularly, to circuits which incorporate a crystal resonator for generating an oscillator signal having a relatively high level of frequency stability.

BACKGROUND OF THE INVENTION

High precision oscillators are required in many electronic devices as a master clock or frequency source, from which all other time intervals and operational frequencies are derived. Quartz crystal resonators are often used in such oscillators because the resonant frequency of the crystal is very stable with respect to temperature. Ideally, the frequency of the oscillator would be the same as the unperturbed resonant frequency of the crystal resonator. Oscillator circuits, however, never oscillate exactly at the unperturbed frequency of the crystal. The crystal resonator can be fabricated with a high quality factor, which is denoted in the art as its Q, so that the resonant frequency of the crystal is not easily perturbed by associated circuitry.

In a prior art component assembly known as the 10811 Oscillator used in various commercial products manufactured, sold and shipped by the Hewlett-Packard Company (HP), the assignee of the present patent application, a mode C, SC cut quartz crystal is put into an oven and maintained at a constant temperature of about 82° C. regardless of ambient temperatures ranging from −30° C. to +70° C. This arrangement, along with the extremely low temperature coefficient of frequency of the crystal used in the 10811 Oscillator, results in the holding of the unperturbed crystal frequency within about one part in $10^{10}$ over the full ambient temperature range. The associated circuitry in the 10811 Oscillator typically adds frequency perturbations on the order of several parts in $10^9$ over the same ambient temperature range.

However, as modern applications require higher levels of stability, it is relatively difficult to design associated circuitry which maintains a sufficiently low degree of perturbation to achieve the required stability. Accordingly, there is a need for improving the associated circuitry used in oscillators.

SUMMARY OF THE INVENTION

The above-mentioned problems arising in prior art oscillator circuits are overcome by provision of an oscillator made in accordance with the teachings of the present invention. In a preferred embodiment of the present invention, a conventionally known quartz crystal resonator forms one arm of a bridge circuit. The bridge circuit is connected via one of its ports to a voltage controlled oscillator (VCXO) stage. At an output of a second port of the bridge circuit is a Radio Frequency (RF) signal which is indicative of how close the crystal resonator is to its resonance level. A demodulator circuit mixes the signals from the two ports of the bridge circuit to produce a direct current (DC) signal which is sent to the VCXO stage. If the crystal resonator is vibrating at its resonant frequency, the oscillator continues its operation unchanged. If the resonator no longer vibrates at its resonant frequency, the voltage controlled oscillator stage responds to the associated error signal from the demodulator circuit and the reactance of the voltage controlled oscillator stage is changed so that the vibrating frequency of the resonator is subsequently changed and returned to its resonant frequency. This arrangement results in an Automatic Frequency Control (AFC) loop for maintaining stability of the oscillator signal. An Automatic Level Control (ALC) circuit is connected to the bridge circuit and VCXO stage so that the oscillator operates with stable amplitude, since non-linearities in the quartz crystal make its frequency sensitive to the drive power of the signal exciting the resonator.

BRIEF DESCRIPTION OF THE DRAWINGS

The features and advantages of the present invention will be apparent by reference to the following detailed description of the preferred embodiments when taken in conjunction with the following list of drawings, where like reference numerals refer to like elements.

DETAILED DESCRIPTION OF THE PREFERRED EMBODIMENTS

Figure 1A:
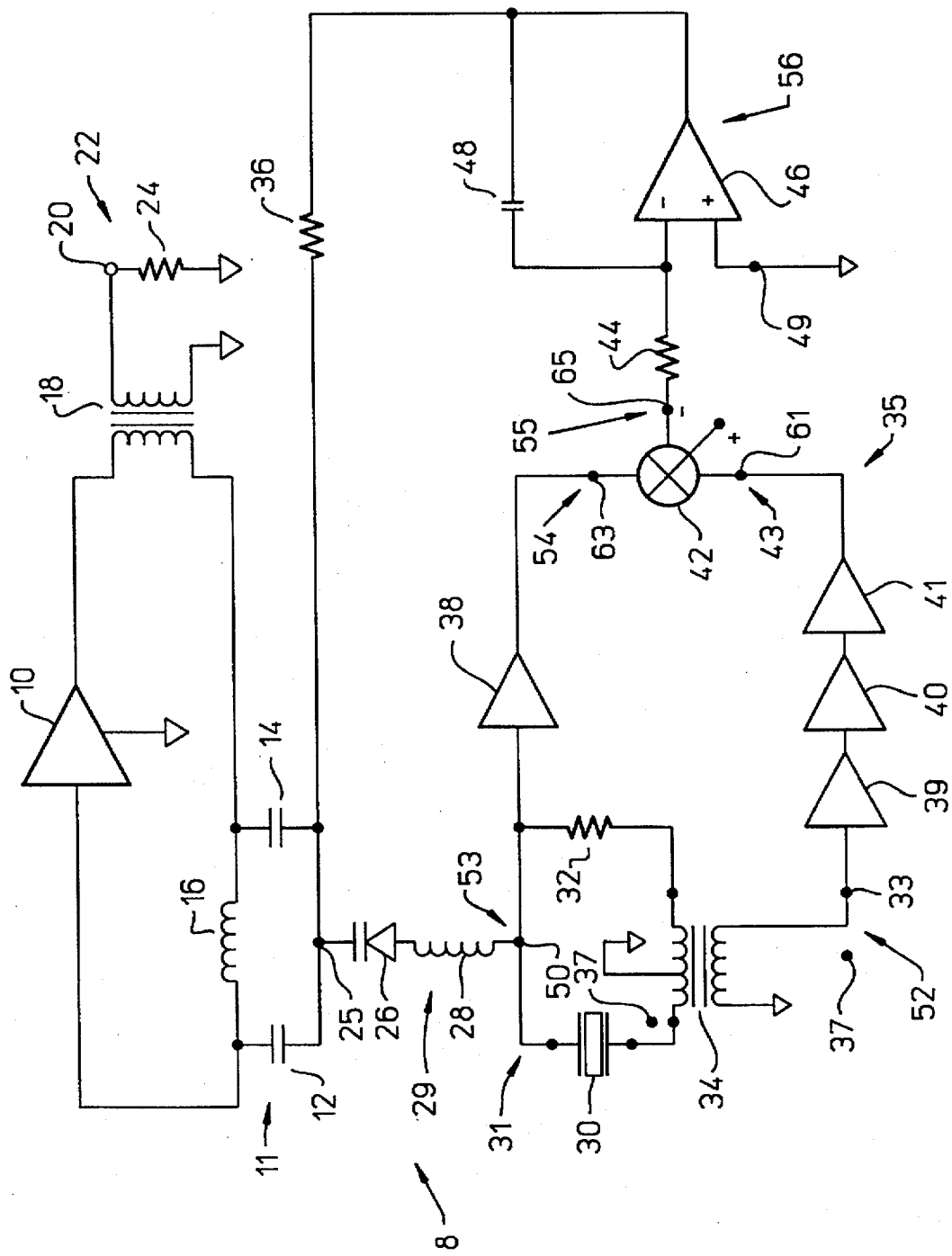
FIG. 1A is a schematic of a preferred embodiment of the present invention.
Figure 1B:
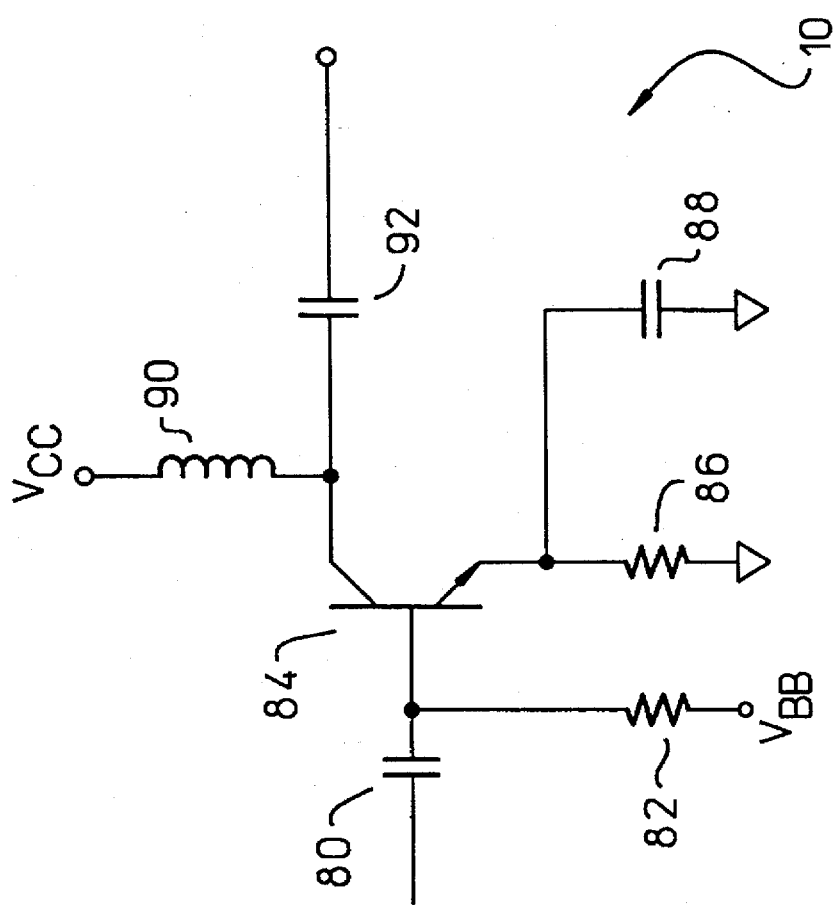
FIG. 1B is a schematic of a conventional bipolar transistor RF amplifier used in the oscillator shown in FIG. 1A.

FIGS. 1A & 1B depict a preferred embodiment of an oscillator 8 made according to the teachings of the present invention. A conventional RF amplifier 10 is an inverting type with relatively high input and output impedances. The output current of the amplifier 10 is sent to a conventional pi-network 11 comprising capacitors 12 and 14 and inductor 16 via the primary impedance of a transformer 18. On the other side of the transformer 18 is a terminal 20 where an oscillator output signal 22 would appear and to which a load impedance 24 is connected. If node 25 were grounded and the pi-network 11 were operated at its resonant frequency, the phase shift of a signal flowing through the network would be 180 degrees. Together with the 180 degree phase shift produced by the amplifier 10, this arrangement results in 0 degree net loop phase shift, which is one of the required conditions for the network to oscillate. Another condition required to initiate oscillation is to have greater than unity net loop gain. When the net loop gain is equal to unity, the oscillation is maintained in steady state. This other condition depends on the relationship between the transconductance of an active component in the amplifier 10, the Q of the inductor 16, and the ratio of the capacitances of capacitors 12 and 14. As will be described in a later portion of this description in connection with FIG. 1B, the active element of the amplifier 10 is a transistor.

At node 25 is connected one end of a varactor diode 26 (functioning as a capacitor) which is in series with an inductor 28 and together form a series resonant LC circuit 29. The inductance of the inductor 28 is chosen so that the LC circuit 29 resonates at the resonant frequency of a quartz crystal resonator 30 when the bias voltage of the varactor diode 26 is in the center of its range. A bridge circuit 31 is formed by the crystal resonator 30 and an image resistor 32 connected to a hybrid transformer 34. As is the convention, the phase of each coil of the transformer 34 is indicated by the dots 37. The value of the image resistor 32 is equal to the Equivalent Series Resistance (ESR) of the resonator 30. An output port 50 of the bridge circuit 31 is connected in series between the inductor 28 and a ground.

The bias circuit for the varactor diode 26 includes the inductor 28, resistor 32, transformer 34, and a resistor 36, with the capacitors 12 and 14 connected for blocking the bias voltage. When the bias voltage is not in the center of its range, the reactance of the series resonant LC circuit 29 is either net inductive or net capacitive, which will result in a pulling of the frequency of oscillation below or above the frequency of crystal resonance, respectively. In the preferred embodiments of the present invention, the resonator 30 is a quartz crystal. A more detailed description of such quartz crystal is provided in an article entitled, "SC-Cut Quartz Oscillator Offers Improved Performance," *Hewlett-Packard Journal*, March 1981, pp. 20–29.

Part of a frequency stabilization loop 35 comprises the resistor 36, LC circuit 29, an RF amplifier 38, and a mixer 42. The amplifier 38 amplifies the signal at the output port 50. Another part of the stabilization loop 35 includes three cascaded tuned RF amplifiers 39, 40 and 41 and the mixer 42. The three RF amplifiers amplify the signal from a port 33 of the bridge circuit 31. The output of the mixer 42 is connected to a resistor 44 which in turn is connected to the inverting input of an operational amplifier 46 and a capacitor 48. The non-inverting input 49 of the operational amplifier 46 is grounded.

The frequency stabilization circuit 35 begins with the secondary winding of the transformer 34. The magnitude and phase of an RF signal 52 which passes through the port 33 into the frequency stabilization circuit 35 is proportional to the magnitude and phase of the reactance of the crystal resonator 30. The phase of the signal 52 at the port 33 with respect to that for a signal 53 at port 50 is –90 (negative ninety) degrees when the net reactance of the crystal resonator 30 is inductive, which occurs when the frequency of oscillation is above the resonant frequency of the crystal resonator. Similarly, the phase of the signal 52 at the port 33 is +90 (positive ninety) degrees when the frequency of oscillation is below the resonant frequency of the crystal resonator. In the very narrow frequency range where the amplitude of the signal 52 is near its minimum, the phase transitions continuously in a region from +90 to –90 degrees as the frequency is increased. This transition region is typically a few milliHertz wide. Tuned RF amplifiers 39, 40, and 41 amplify the signal 52, which is an error signal from the bridge circuit 31. The amplifier 38 amplifies the signal 53, which is a reference signal from the bridge circuit.

The amplifier 38 is an inverting type so that the phase of a signal 54 appearing at one input of the mixer 42 is 180 degrees with respect to that for the signal 52. Since the amplifiers 39, 40, and 41 are also basically inverting amplifiers, the phase of a signal 43 appearing at another input of the mixer 42 would also be 180 degrees with respect to the phase of the signal 52 in the absence of any additional phase shifts. However, the amplifiers 39, 40, and 41 are actually tuned to a frequency preferably a few percent below the crystal frequency such that an additional 30 degrees phase lag occurs in each amplifier, for a total of –90 degrees of extra phase shift. Thus, the phase of the signal 43 is –270 degrees (or equivalently +90 degrees) with respect to the signal 52.

The result of all of the above described phase shifting is that the phase of the signal 43 with respect to the signal 54 is 180 degrees when the frequency of oscillation is above the resonant frequency of the crystal resonator 30, and 0 degrees when the oscillation frequency is below the resonant frequency. Accordingly, a positive DC output signal 55 is produced at an inverting output of the mixer 42 when the oscillation frequency is above the resonant frequency and a negative DC output signal 55 when the oscillation frequency is below the resonant frequency. The signal 55 drives the output of an inverting integrator 56 in a negative direction which reduces the oscillation frequency when it is above the resonant frequency. In like manner, the signal 55 drives the output of the inverting integrator 56 in a positive direction which increases the oscillation frequency when it is below the resonant frequency. In both cases, a so-called servo loop is created which operates to drive the oscillation frequency so that it converges to the resonant frequency.

A power supply (not shown) connected to amplifier 10 provides the electrical energy needed for producing a drive signal which passes through the LC circuit 29 for exciting the crystal resonator 30 to vibrate. As long as the input impedance of the amplifier 38 is high, the bridge circuit 31 is essentially transparent at node 50 to the oscillator 8.

The demodulator function of the mixer 42 is insensitive to any error signals caused by a mismatch between the image resistor 32 and the ESR of the crystal resonator 30 because the phase of the extraneous signal due to the mismatch appearing at the RF input 61 of the mixer 42 would be in quadrature with the phase of the signal appearing at the LO input 63 of the mixer 42. The effect of drift in the phase shift caused by the amplifiers 39, 40, and 41 is to reduce immunity to resistance imbalance, but in the absence of such imbalance, the only deleterious effect is to reduce the error loop gain by a factor equal to the cosine of the phase error. Accordingly, the accuracy of the circuit is not critical with respect to the phase stability of the amplifiers 38, 39, 40, and 41. An IF (Intermediate Frequency) signal appearing at an output terminal 65 of the mixer 42 is integrated by the integrator 56 to provide a DC control voltage that is fed back to the bias circuit of the varactor diode 26 via resistor 36 and correspondingly changes the capacitance of the varactor diode 26. The oscillator 8 is thus kept in tune to the frequency that balances the bridge circuit 31, which occurs when the crystal resonator is vibrating at its exact series resonant frequency.

For frequencies more than a few kilohertz away from the resonant frequency of the resonator 30, the impedance of the bridge circuit 31 between node 50 and ground becomes many hundreds of ohms. Since the amplifier 10 preferably includes a grounded emitter bipolar transistor (not shown in FIG. 1A but depicted in FIG. 1B), there is no low impedance path from the base (the input of the amplifier 10) to the emitter, which is grounded. Since the two capacitors 12 and 14 only connect to ground through the bridge circuit 31, the high impedance of this path prevents any RF base current from flowing so there is no base-recombination current noise at those frequencies. By inserting the primary winding of the transformer 18 in series with the collector of the amplifier 10, the oscillator signal 22 at the terminal 20 is extracted without introducing a path to ground that would cause base-recombination noise. With base-recombination noise current eliminated, the remaining noise mechanism in the transistor arises from collector shot noise current. This is typically 10 to 15 dB less than the base-recombination noise current. Thus, the so called phase noise floor, being the phase noise at offsets from the carrier of more than a few kHz, is reduced by a like amount. This same principle is used in the aforementioned 10811 Oscillator, except that in the 10811 Oscillator an extra grounded-base buffer amplifier must be added to implement it. The technique taught here eliminates the need for this extra amplifier. The extra load impedance added in series with the collector by the transformer 18 is virtually transparent to the operation of the oscillator 8 because of the typically high collector impedance of the transistor.

Depicted in FIG. 1B is a detailed schematic of a preferred embodiment of the amplifier 10 where a capacitor 80 is connected to a resistor 82 and the base of a conventional bipolar transistor 84. The resistor 82 is connected to a voltage source $V_{BB}$ (not shown in detail). The transistor 84 is connected to a resistor 86 and a capacitor 88 which are both grounded and result in the grounding of the emitter of the transistor 84. The transistor 84 is also connected to an inductor 90 and a capacitor 92. The inductor 90 is connected to a voltage source Vcc (not shown in detail).

Figure 2:
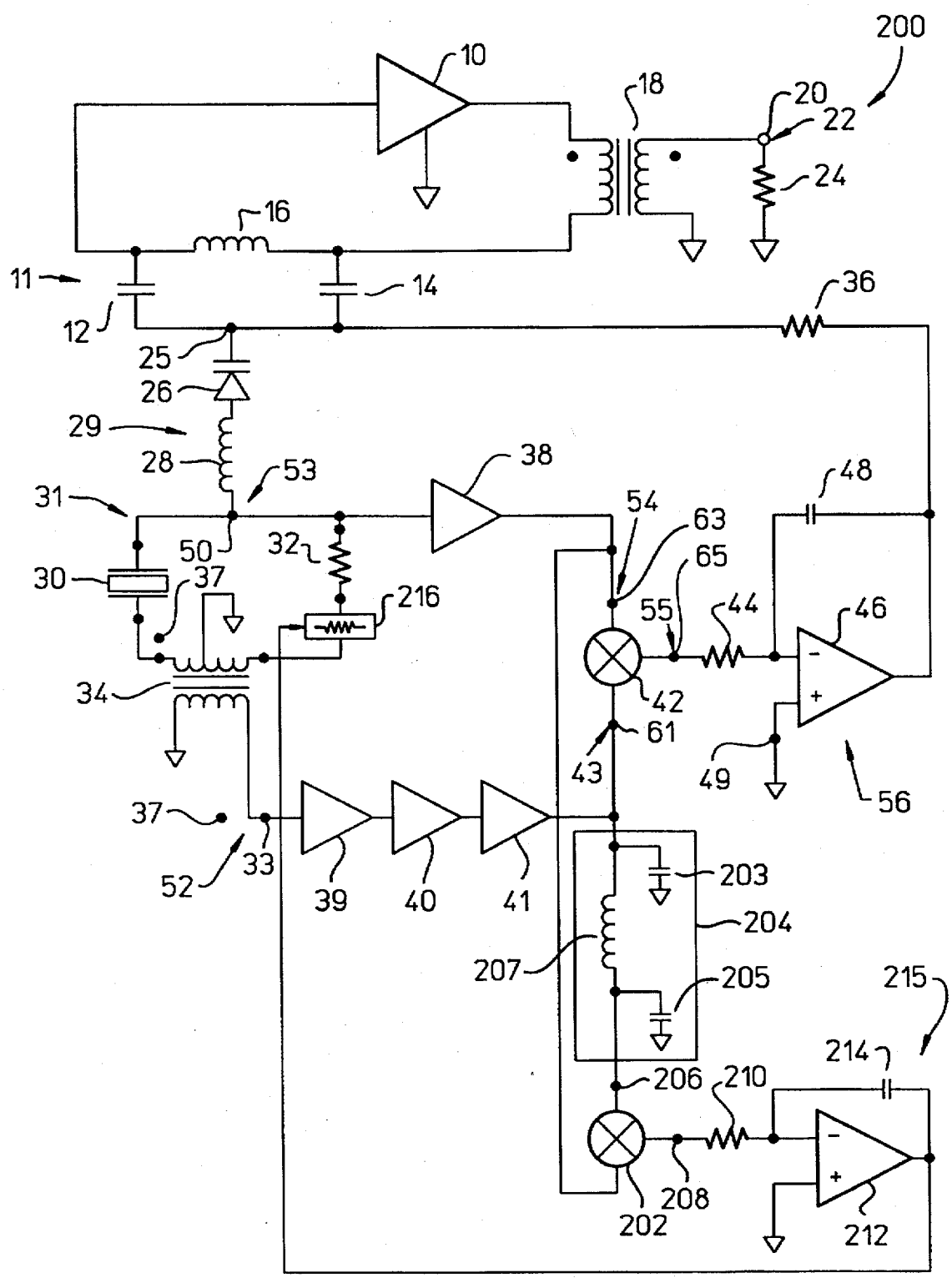
FIG. 2 is a schematic of an expanded embodiment of the present invention which includes a second synchronous demodulator added to the demodulator depicted in FIG. 1A.

With reference to FIG. 2, an oscillator 200 is depicted which is an alternate preferred embodiment the oscillator 8 shown in FIGS. 1A & 1B. The oscillator 200 includes a second synchronous demodulator which is a mixer 202 operating with its RF input signal shifted 90 degrees with respect to the corresponding RF signal applied to the mixer 42. This arrangement is used to compensate for errors in setting the resistor 32 to the exact value of the ESR of the crystal resonator 30. In this embodiment, the resistor 32 is deliberately made slightly smaller than the value which would balance the bridge circuit. A voltage controlled resistance 216 is inserted in series with the resistor 32. Hence, the control voltage for the voltage controlled resistance 216 can be used as a fine adjustment. The mixer 202 generates a DC error signal proportional to the difference between the resistance of the image resistor 32 and the ESR of the crystal resonator 30. It is insensitive to the reactance of the resonator 30. This is in contrast to the mixer 42 which generates an error signal proportional to the reactance of the resonator 30 but is insensitive to resistance. If the mixer 202 detects a resistive imbalance in the bridge circuit 31, an integrator 215 changes the voltage controlled resistance 216 in the correct direction so that the sum of the voltage controlled resistance 216 and the resistor 32 is equal to the ESR of the resonator 30 and the unbalanced condition is thus eliminated.

In addition to the elements used for the oscillator 8, the oscillator 200 includes a conventional 90 degree phase shifter 204 connected to the output of the amplifier 41. The phase shifter 204 is preferably implemented as two grounded capacitors 203 and 205 and an inductor 207. The output of the 90 degree phase shifter 204 is connected to an input terminal 206 which is the RF input for the mixer 202. The IF output terminal 208 of the mixer 202 is connected to the integrator 215 which is a resistor 210 connected to an inverting input of an operational amplifier 212 and a capacitor 214. A non-inverting input to the operational amplifier 212 is grounded and the output is applied to the voltage controlled resistance 216, which is well known in the prior art in various forms such as PIN diodes and triode region JFETs.

Figure 3:
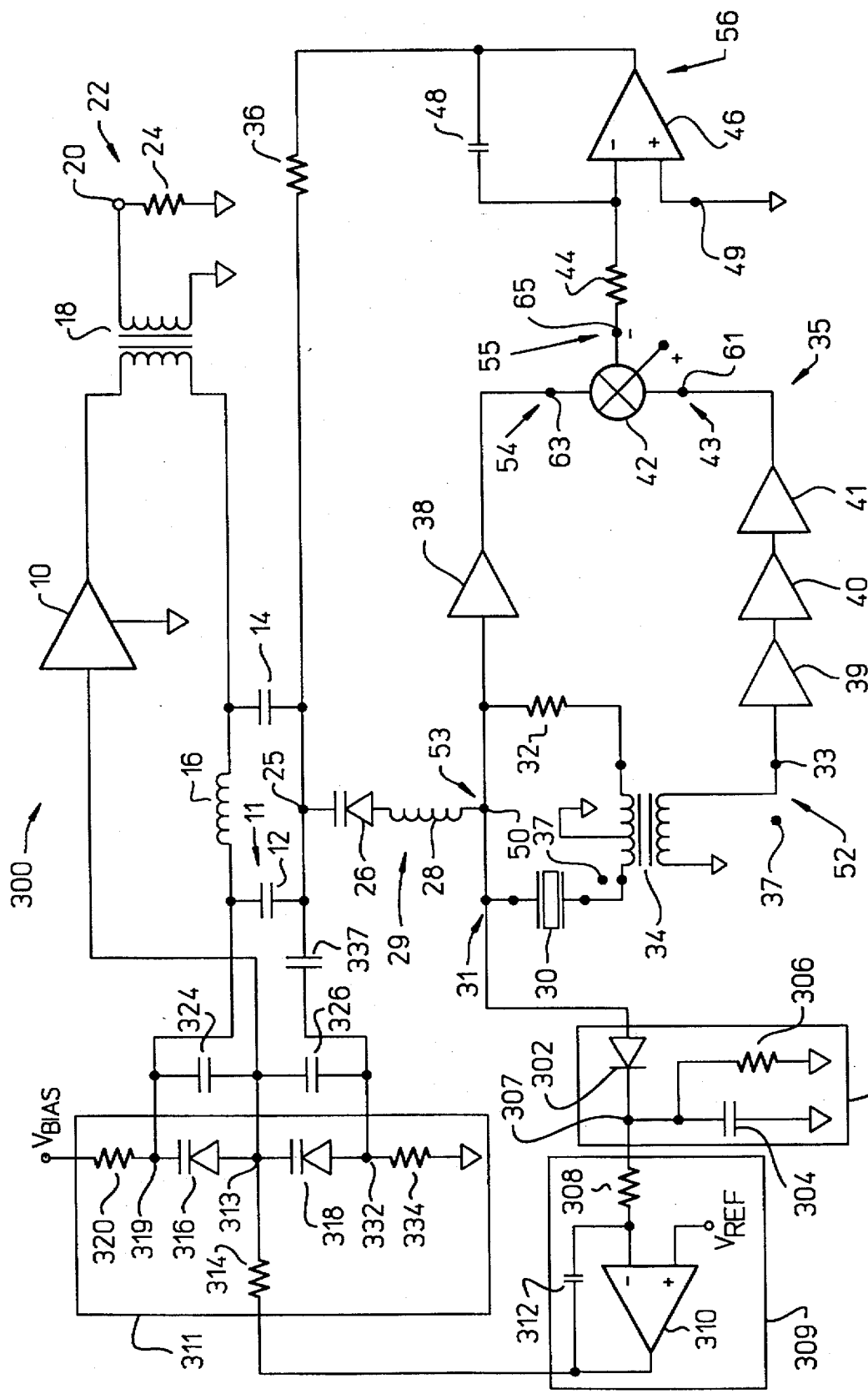
FIG. 3 is a schematic of still another embodiment of the present invention which includes an Automatic Level Control (ALC) circuit.

An oscillator 300 is depicted in FIG. 3 which is another preferred embodiment of the present invention. The oscillator 300 is similar to the oscillator 8 shown in FIG. 1 but includes additional elements forming an ALC (Automatic Level Control) for controlling the drive level of the signal exciting the crystal resonator 30. It is known that the resonant frequency of the crystal is sensitive to the drive level being applied because of the non-linear intrinsic properties of the quartz material used in the crystal resonator 30. A description of the operation of the ALC will first be given before a detailed description is provided for its specific components. The ALC operates so that an RF voltage at node 50 is rectified by a diode detector 305 which produces a DC voltage at a node 307 that is roughly proportional to the peak RF voltage at the node 50, except for an offset (preferably of about 0.2 volts) due to the turn-on voltage of a Schottky diode 302. An integrator 309 integrates the DC voltage at the node 307 and applies it to a capacitive voltage divider 311. The voltage at a node 313 determines the divide ratio of the voltage divider 311 which in turn controls the feedback around the amplifier 10. By regulating this feedback, the amplitude is controlled so as to servo the RF voltage at the node 50 to a constant value. When the bridge circuit 31 is in balance, this arrangement will also servo the drive power being applied to the crystal 30 to a constant value.

The oscillator 300 further includes a diode 302 having its anode connected to the node 50. The cathode of the diode 302 is connected to a bypass capacitor 304 and a DC load resistor 306. The cathode of the diode 302 is also connected to a resistor 308 which in turn is connected to the inverting input of an operational amplifier 310 and a capacitor 312. The anode of the diode 302 is connected to ground via the resistor 32 and the transformer 34. The non-inverting input of the amplifier 310 is connected to a voltage source $V_{REF}$ and the output is connected to a resistance 314 for biasing two varactor diodes 316 and 318. The biasing of the varactor diodes 316 and 318 is conventional. The diode 316 is connected in parallel with a capacitor 324 and the diode 318 is connected in parallel with a capacitor 326. A node 319 connects the cathode of the varactor diode 316 to a resistor 320. A positive bias voltage from a source not depicted in FIG. 3 is applied to the node 319 via the resistor 320. A terminal 313 connected between the capacitors 324 and 326 is also connected to the input of amplifier 10. The terminal 313 is also connected between the varactor diodes 316 and 318. The anode of the varactor diode 318 at terminal 332 is connected to ground via a resistor 334.

If the voltages across the varactor diodes 316 and 318 are respectively $V_A$ and $V_B$, if the capacitances of the varactor diodes 316 and 318 are respectively $C_A$ and $C_B$, and if the equivalent capacitance denoted by the value C of equation (A) given below is kept constant, then a variable capacitive voltage divider is created which will not appreciably pull the frequency of the oscillator 300 as the divide ratio $\{V_A/(V_A+V_B)\}$ is changed. This arrangement thus minimizes the interactions between the ALC loop and the AFC loop (both to be described).

$$C = (C_A * C_B)/(C_A + C_B) \tag{A}$$

The capacitance versus voltage characteristic of varactor diodes is conventionally classified by a parameter commonly denoted by y. If y is unity, equation A is automatically satisfied with the value of the capacitors 324 and 326 set to zero. For higher values of y, such as 2, the values of the capacitors 324 and 326 can be chosen to allow equation A to be approximately obeyed. For example, with BB512 diodes, 150 pF for the capacitors 324 and 326 will obey equation (A) within one percent (1%), where $C_A$ is now the sum of the capacitances of the varactor diode 316 and the capacitor 324 and $C_B$ is the sum of the capacitances of the varactor diode 318 and the capacitor 326. The ability to use higher y diodes is important because they are the only kind available in the large values typically needed for the varactors diodes 316 and 318.

Figure 4:
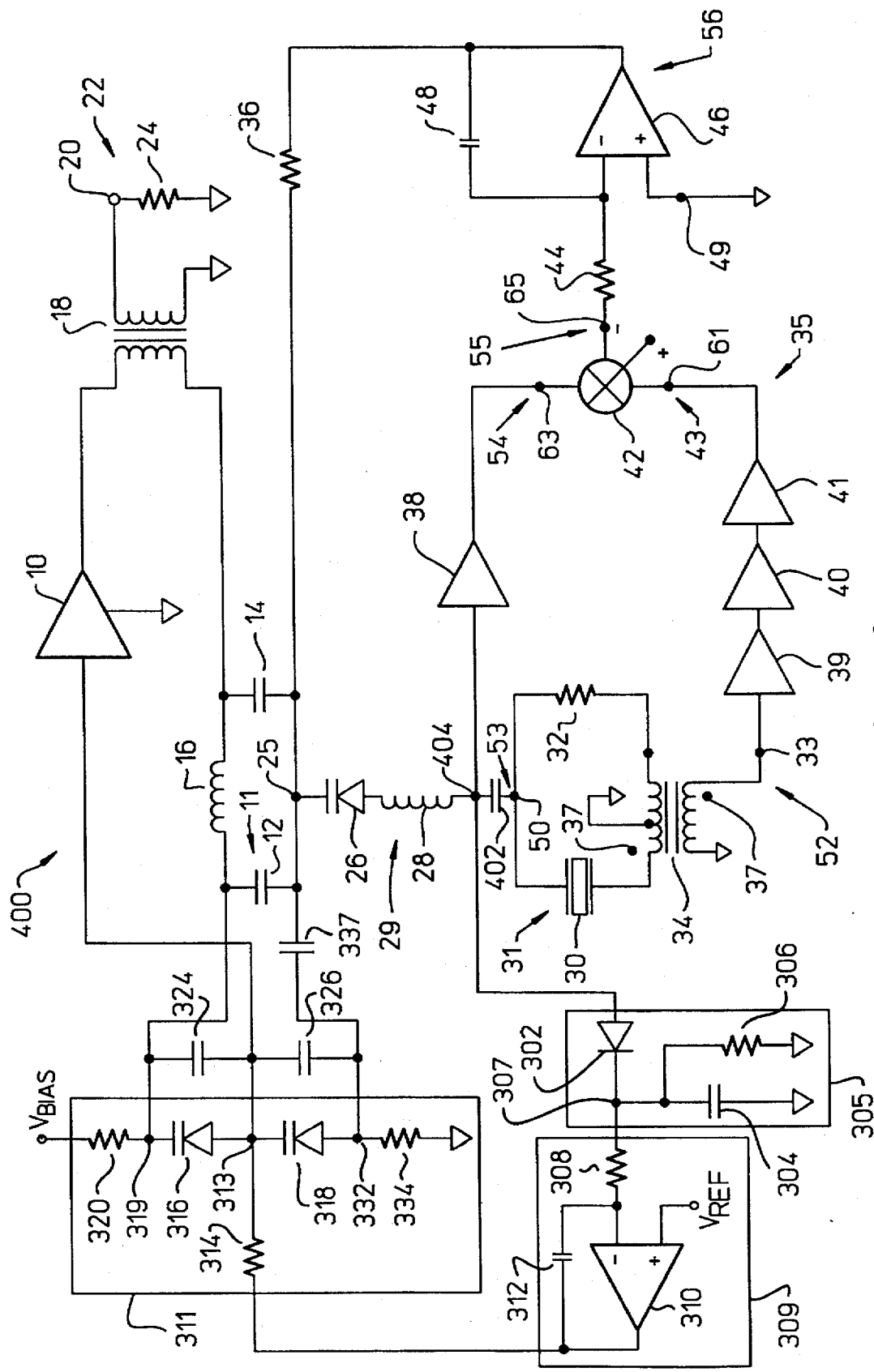
FIG. 4 is an alternate embodiment of the present invention which includes a high precision ALC detector and wide range Automatic Frequency Control (AFC) detector.

Depicted in FIG. 4 is another embodiment of the present invention wherein an oscillator 400 includes a high precision enhanced ALC detector. Oscillator 400 is similar to the oscillator 300 (shown in FIG. 3) except the LC circuit 29 further includes a capacitor 402 connected between node 50 and a terminal 404. The value of the inductor 28 is increased so that the net inductive reactance of the series combination of the inductor 28 and the capacitor 402 in the embodiment shown in FIG. 4 is the same as the previous inductive reactance of the inductor 28 in FIG. 3. The voltage at the terminal 404 is stepped up compared to the voltage at the node 50 in proportion to the loaded Q of the capacitor 402 defined by the following equation (B):

$$Q_L = X_C/(ESR/2) \quad (B)$$

where $X_C$ is the reactance of the capacitor 402 and ESR is the ESR of the crystal resonator 30. The advantage of stepping up the voltage is that the relative contribution of error due to thermal drift of the diode turn-on voltage is reduced because it is inversely proportional to signal amplitude. The drift in turn-on voltage is the main source of temperature induced error in diode detectors. If the capacitor 402 is a zero-temperature coefficient type (which is commonly known as COG or NP0), the voltage across it for a given excitation current into the bridge circuit 31 will be constant in spite of temperature variations. So if the voltage at the terminal 404 is held invariant over temperature, the current through the resonator 30 will also be invariant. A potential disadvantage of this high precision ALC detector in the oscillator 400 is that it substantially increases the uncorrected frequency drift of the oscillator because of the increased sensitivity of frequency to the inductance of the inductor 28 as its inductance is raised. However, in the present invention, the oscillator is under closed loop control of the bridge circuit 31 and the inductor 28 does not affect the balance frequency of the bridge circuit 31.

The input of the amplifier 38 is connected to the terminal 404. In the prior embodiment shown in FIG. 3, the input of the amplifier 38 is connected directly to the bridge circuit 31 at the port 50. The embodiment of FIG. 4 is preferred over that of FIG. 3 because it enhances several aspects of the AFC system. First, it provides a simple way of implementing the 90 degree phase shift required to interface properly with the synchronous demodulator 42. Second, it eliminates some problems that occur in the previous embodiment when the bridge was far out of balance. A detailed description of the enhanced ALC detector will now be presented below.

The reactance of the capacitor 402 should be chosen to be much larger than the impedance at the port 50 of the bridge 31. A typical ratio would be 20 to 1. Assuming this rule is followed, then the voltage at the terminal 404 is given to a good approximation by the product of the current through the capacitor 402 and the reactance of capacitor 402. In other words, the magnitude of the voltage at the terminal 404 is proportional to the magnitude of the bridge current at terminal 50. As described previously, the ALC circuit takes advantage of this to stabilize bridge current. Furthermore, the phase of the voltage at the terminal 404 lags by almost exactly 90 degrees with respect to the bridge current, because of the capacitive reactance involved. This built in 90 degree phase shift can be used instead introducing a 90 degree phase in the amplifiers 39, 40, and 41. The advantage of this, besides simplicity, is that the 90 degree phase shift implemented by the capacitor 402 is inherently more accurate than a phase shift implemented in the amplifiers 39, 40 and 41. When implemented as in FIG. 4, the AFC synchronous detector 42 compares the phase of the bridge current with the null port voltage at the terminal 52. In other words, the bridge current provides the LO signal (after amplification by the amplifier 38). This is in contrast to FIG. 3, where the bridge voltage at the terminal 50 is compared with the null port voltage at the terminal 52.

Using the bridge current instead of the bridge voltage as the LO signal source eliminates two problems that occur when the bridge is far out of balance. The first problem is a side effect of the enhanced ALC detector. When the bridge is far out of balance, the input impedance of the port 50 increases considerably above its balance value. With a constant bridge current assured by the enhanced ALC detector, the voltage at port 50 rises under severe out of balance conditions. If the LO signal were sourced from the terminal 50 (as in FIG. 3), its amplitude would increase substantially when the bridge was out of balance. This considerably complicates the design of the synchronous demodulator 42. By taking the signal from terminal 404, there is guaranteed to be no amplitude variation whatsoever because the voltage at this point is controlled by the ALC detector to be at a constant amplitude. A second problem is that the phase relationship between the bridge voltage and the null voltage shifts away from the plus or minus 90 degree phase shift when near a null towards a 0 degree phase shift as the bridge imbalance increases. This phase error results in improper operation of the synchronous demodulator 42 such that the AFC detector may not converge to resonance, when the terminal 50 is used as the LO source. However, the bridge current always has a phase shift of plus or minus 90 degrees with respect to the null port voltage, no matter how far the crystal is off resonance. Hence the enhanced AFC of FIG. 4 always converges to resonance.

Figure 5:
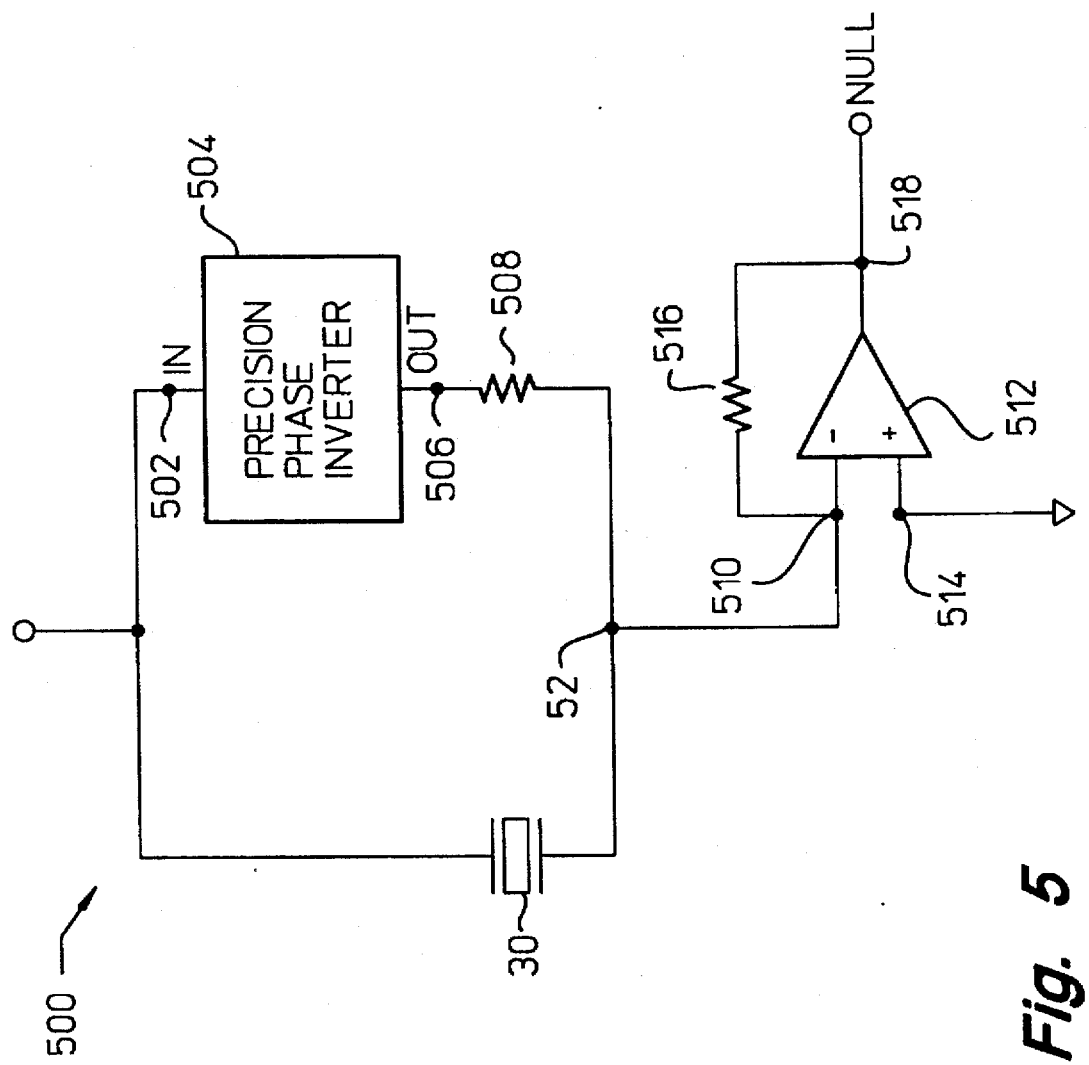
FIG. 5. depicts a schematic of an electronic bridge circuit which is an alternative to the bridge circuit shown in FIG. 1.

FIG. 5 depicts still another embodiment of the present invention where the transformer 34 shown in FIGS. 1–4 is eliminated and an electronic bridge 500 replaces the bridge circuit 31 shown in those prior figures. In FIG. 5, the crystal resonator 30 is connected to an input terminal 502 of a precision phase inverter 504 (which will be described in more detail). An output terminal 506 is connected to an image resistor 508. The image resistor 508 is connected to the resonator 30 and an inverting input 510 of an operational amplifier 512. The inverting input 510 of the amplifier 512 is also connected to a resistor 516. The resistor 516 is connected to an output terminal 518 of the operational amplifier 512. A non-inverting input 514 of the operational amplifier 512 is grounded. The electronic bridge 500 eliminates the magnetic susceptibility of the magnetic core of the transformer. The size of the transformer, particularly the height is typically greater than the components used in the electronic bridge 500. The electronic bridge 500 is amenable to being implemented on a monolithic integrated circuit, which is a very desirable attribute for commercial applications.

The theory of operation of the transformerless electronic bridge 500 will now be presented. Like the previously described bridge, it must meet two requirements. The oscillator port must have an input impedance characteristic similar to a crystal and the null port must have an error signal such that the polarity of the phase when above resonance is the opposite of the polarity of the phase when below resonance. In FIG. 5, the operational amplifier 512 is configured as a transconductance amplifier having an input impedance of essentially zero at its input terminal 510. The voltage at the operational amplifier output terminal 518 is equal to the input current divided by the resistance of the feedback resistor 516. Since the input terminal 510 acts as a virtual ground for the crystal 30, the input impedance of the oscillator port is equal to the shunt combination of the impedance of the crystal and the input impedance of the precision phase inverter 504 (to be described in a later section). Since the impedance of the inverter 504 is very high, the input impedance of the oscillator port is practically the same as the crystal impedance. Hence the first requirement for the bridge is met.

With regard to the null port at the terminal 52, the situation at resonance is that the impedance of the crystal is a resistance equal to the image resistor 508. The precision phase inverter 504 has an output voltage that is equal in magnitude and opposite in phase to its input voltage. Hence the voltage on the upper terminals of the crystal 30 and the image resistor 508 are equal and opposite. Since the resistances are equal, the current flow through the crystal will be equal and opposite to the current flow through the image resistor 508. Therefore, no current will flow into the transconductance amplifier 512. The precision phase inverter 504 effectively performs the function previously done by the hybrid transformer. When the crystal is off resonance, the operation of the transformerless electronic bridge 500 is similar to the transformer type bridge described previously, with the phase shift between the ports being either 90 degrees ahead or behind depending on the sign of the frequency error.

The accuracy and stability of the electronic bridge 500 depends largely on the degree of precision of the phase inverter. In general, active RF phase inverters are far less precise than commonly available RF hybrid transformers. This is because the operating frequency (e.g., 10 MHz) is a significant percentage of the gain bandwidth product of even the most wideband amplifiers currently available, as is well known in the field of active filters. To overcome this limitation, extraordinary means are needed to stabilize the phase inverter. An active phase inverter can have both amplitude and phase errors. Of the two, the phase error is the major concern since phase is typically much more temperature sensitive than amplitude.

Figure 6:
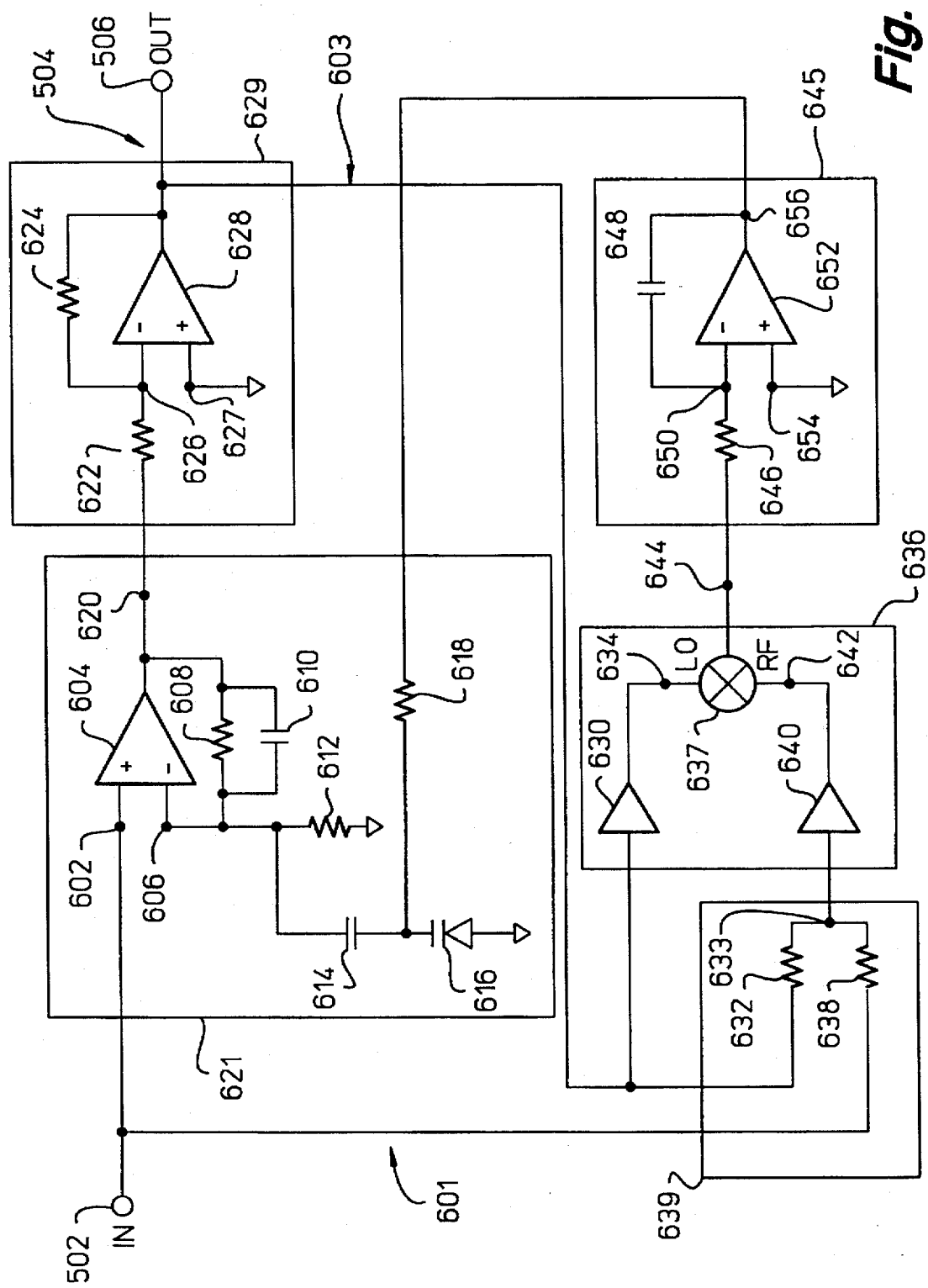
FIG. 6 shows a schematic of a precision phase inverter used in the electronic bridge circuit depicted in FIG. 5.

Depicted in FIG. 6 is a detailed schematic of the precision phase inverter 504 shown in FIG. 5. The phase inverter 504 uses bridge stabilization based on principles very similar to the previously described bridge stabilized oscillator. The difference is that the bridge is now simply a pair of matched resistors. Before a detailed description is given, an explanation will be provided about the theory of operation of the precision phase inverter. The main signal path is from the input terminal 502 through an amplifier 604 with a nominal voltage gain of preferably slightly more than +1, then through a second amplifier 628 having a nominal voltage gain of preferably slightly more than −1, and then to the output terminal 506. The first amplifier 604 provides for a high input impedance as needed in the bridge 500 (in FIG. 5), and the second amplifier 628 performs the basic phase inversion, again as needed by the bridge 500. An added feature of the first amplifier 604 is that the phase can be adjusted by varying the bias voltage across a varactor diode 616. Ideally, the input and output voltage should be equal and opposite. The input and output voltages 601 & 603 are connected respectively to a matched pair of resistors 632 and 638 of a half-bridge circuit 639 connected to an input terminal 633 of an error amplifier 640. The input terminal 633 acts as a summing node for the currents through the matched resistors 632 and 638. If the input and output voltages are equal and opposite, there will be no voltage at the input terminal 633. If not, an error signal will be present having a phase with a polarity the same as the phase error between the signals at the input 502 and the output 506. The phase of the error signal at terminal 642 is compared to the phase of the output signal at terminal 634 by a special synchronous demodulator 636 and used to generate a DC voltage that is integrated by an error integrator 645 and used to drive the varactor diode 616. This feedback corrects the phase error by changing the phase shift through the first amplifier 604. The varactor diode 616 works in conjunction with a feedback network comprising a resistor 612, a capacitor 610, a resistor 608, and the capacitor 614.

A detailed description of the precision phase inverter 504 will now be given. The input terminal 502 is connected to non-inverting input 602 of an operational amplifier 604 having a gain of about +1. An inverting input 606 of the amplifier 604 is connected to a resistor 608, a compensation capacitor 610, another resistor 612, and the DC blocking capacitor 614. The other end of the resistor 612 is grounded. The other end of the capacitor 614 is connected to the cathode of a varactor diode 616 and a resistor 618 which is used for biasing the varactor diode 616. The anode of the varactor diode 616 is grounded. An output terminal 620 of the amplifier 604 is connected to the resistor 608, the capacitor 610 and a resistor 622. An adjustable phase equalizer circuit 621 is formed. The other end of the resistor 622 is connected to a resistor 624 and an inverting input 626 of an operational amplifier 628 having a gain of about −1. A non-inverting input 627 of the amplifier 628 is grounded. As a result, a non-precision inverter 629 is formed.

The output terminal 506 of the precision phase inverter 504 is connected to an output of the amplifier 628, a reference amplifier 630, and one end of the resistor 632. The amplifier 630 is connected to an LO input 634 of a mixer 637. The other end of the resistor 632 is connected to one end of the resistor 638 and the amplifier 640. The amplifier 640 is connected an RF input 642 of the mixer 637 which operates as a synchronous demodulator. An output 644 of the mixer 637 is connected to a resistor 646 whose other end is connected to a capacitor 648 and an inverting input 650 of an amplifier 652. A non-inverting input 654 of the amplifier 652 is grounded. An output 656 of the amplifier 652 is connected to the other end of the biasing resistor 618. The input terminal 502 of the precision phase inverter 504 is connected to the other end of the resistor 638.

In all of the preferred embodiments of the present invention, the crystal resonator 30 is placed in an oven which operates to maintain the crystal material at a prescribed temperature level. The oven enclosure and associated circuitry for heating, sensing, and controlling the interior temperature of the oven can all be conventional and are not depicted. An example of a suitable oven is the oven used for the aforementioned 10811 Oscillator made by HP, but modified to enclose the present invention. However, one advantage of the preferred embodiments of the present invention is that only the crystal resonator is required to be in an oven and the remaining circuitry can be exposed to ambient temperatures of the surroundings. In the 10811 Oscillator, the oven is also used to enclose the other oscillator circuitry connected to the ovenized crystal resonator in order to achieve the desired levels of frequency stability. In a working embodiment of the present invention, the frequency stability was comparable to the that of the 10811 Oscillator but only the crystal resonator of the present invention was ovenized while the associated other circuitry was left exposed to ambient temperatures.

Figure 7:
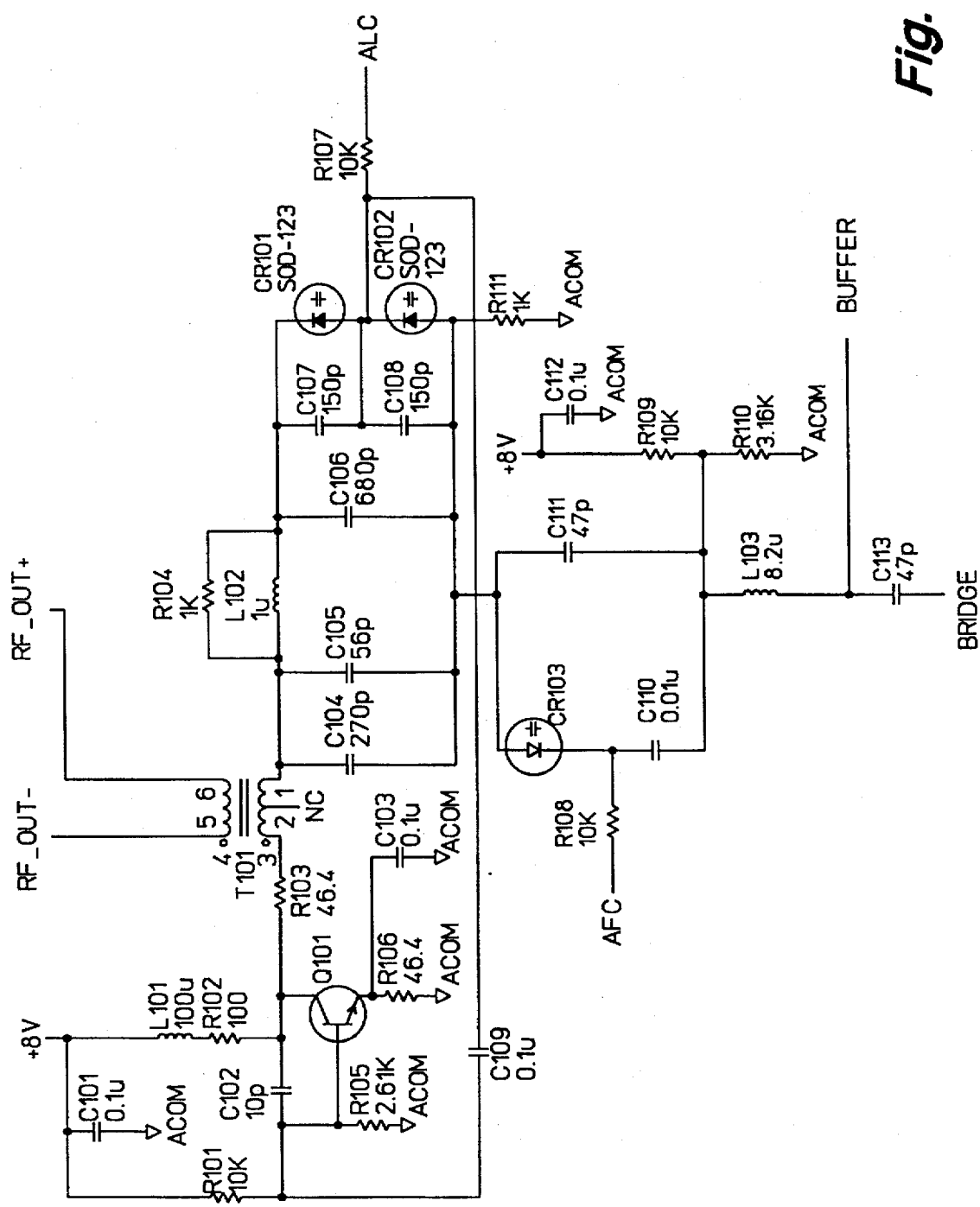
FIGS. 7–11 depict schematics of various portions of a working oscillator circuit made in accordance with the teachings of the present invention.
Figure 8:
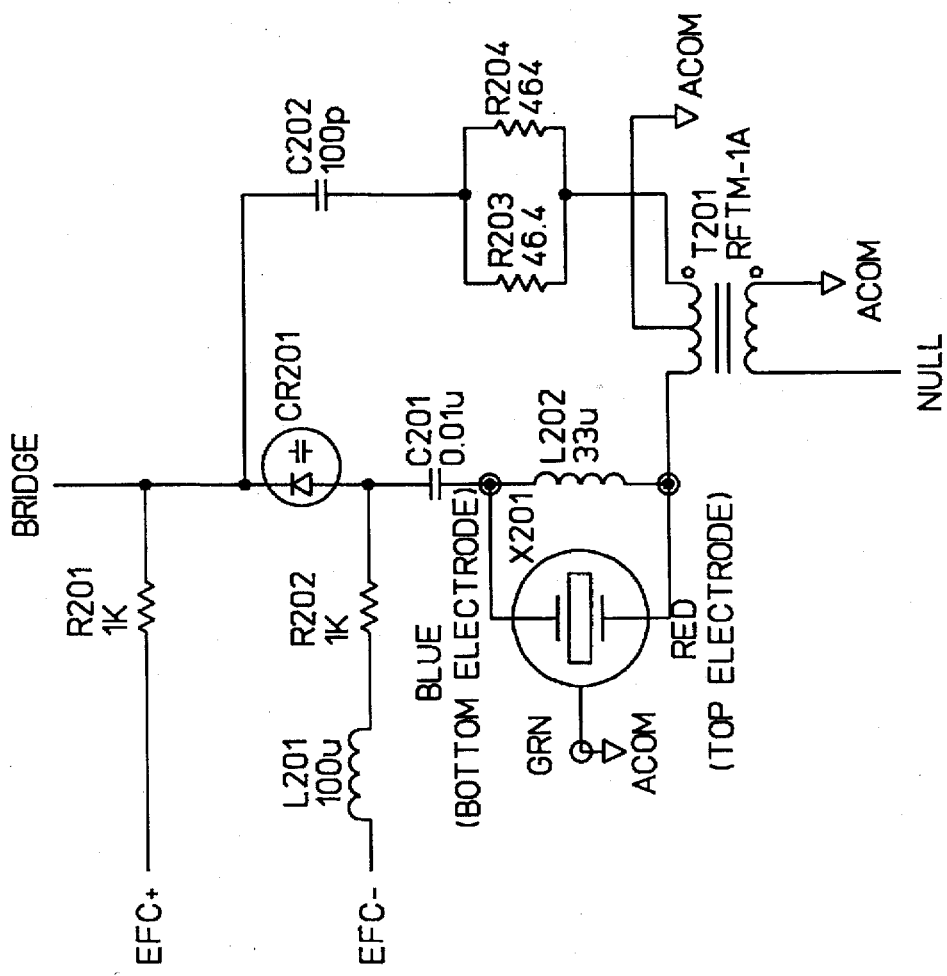
Figure 9:
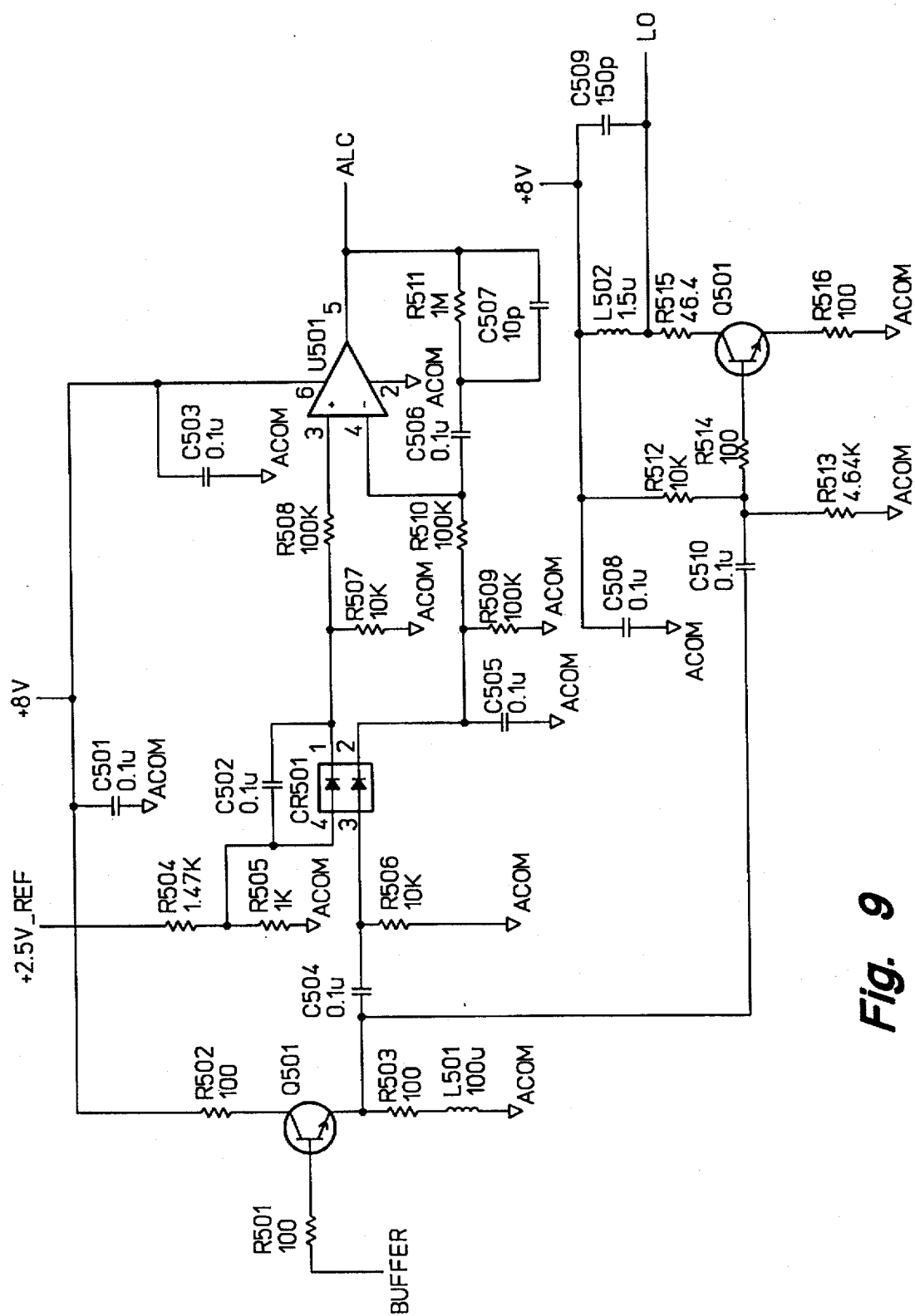
Figure 10:
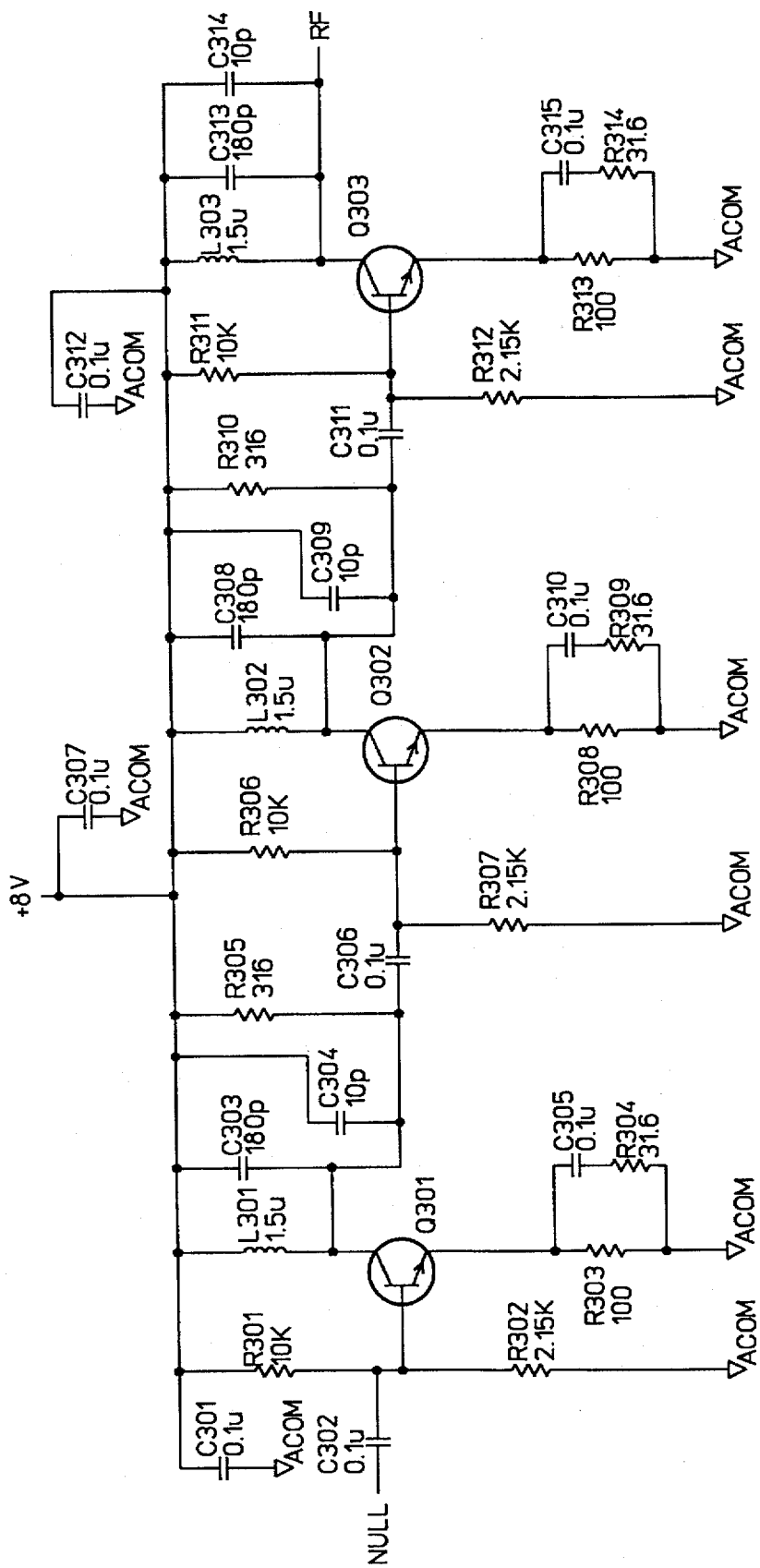
Figure 11:
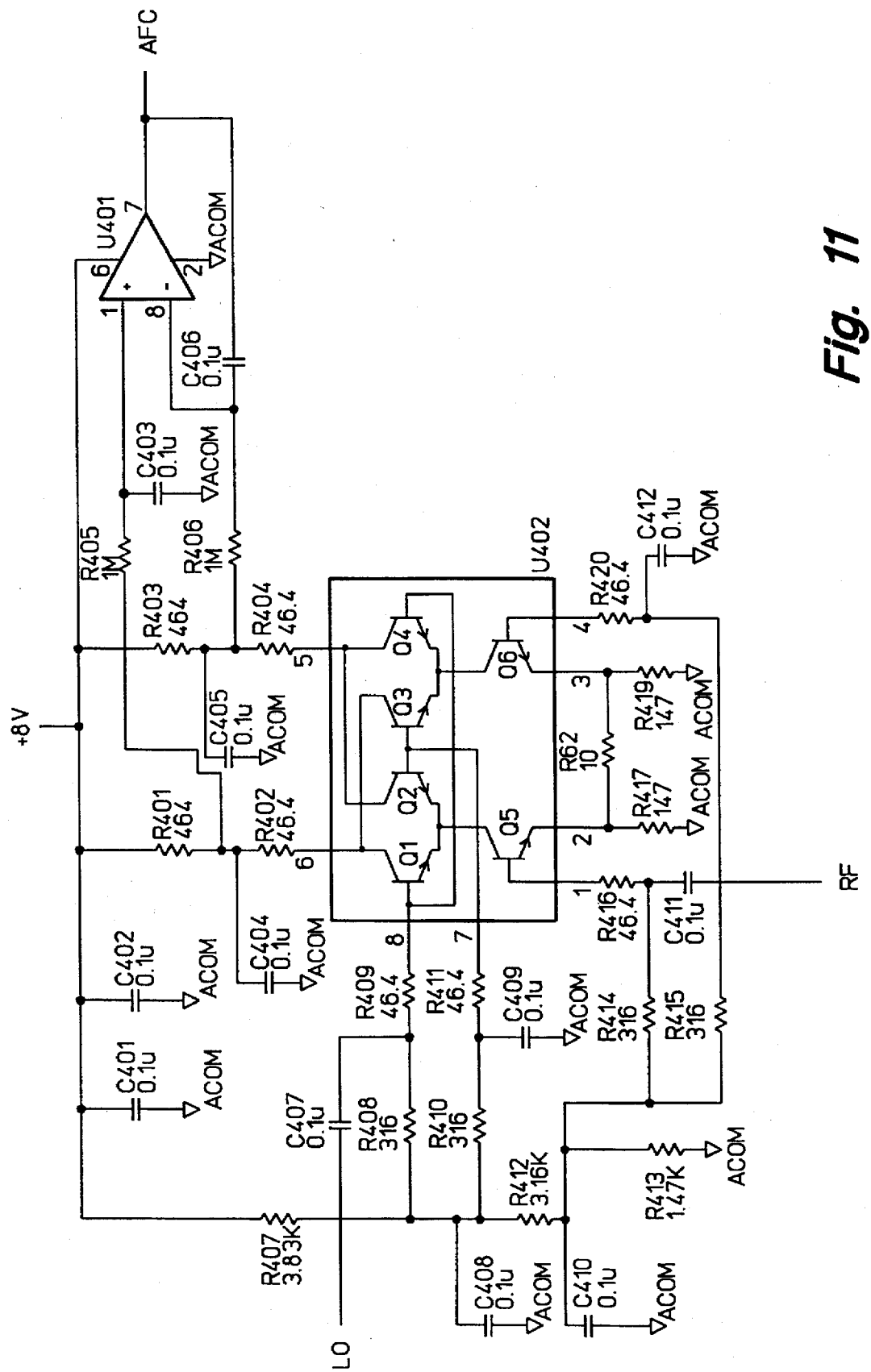

FIGS. 7–11 depict schematics of an actual working embodiment of the oscillator circuit made in accordance with the teachings of the present invention. Specific component values are given. FIG. 7 shows a VCXO stage and FIG. 8 depicts a bridge circuit. FIG. 9 shows an ALC circuit and FIG. 10 depicts an AFC RF amplifier circuit. FIG. 11 shows a synchronous detector and an AFC DC amplifier circuit.

While the present invention has been described and illustrated with reference to specific embodiments, those skilled in the art will recognize that modifications and variations may be made without departing from the principles disclosed by the teachings of the present invention. For example, the present invention can be used as part of an improved temperature compensated crystal oscillator (TCXO). As further explanation of this alternate embodiment of the present invention, a separate circuit senses the temperature of the ambient environment of the crystal. The temperature information is then used to compensate for any temperature induced drift occurring in the oscillator signal produced by the present invention. A conventional TCXO is a well known device that eliminates the need for an oven. Since an oven typically requires a significant amount of power, the conventional and improved TCXO's are useful for those applications where power is limited.

What is claimed is:

1. An oscillator circuit for stabilizing an oscillator signal having a variable frequency comprising:

a resonator for operating at various vibration frequencies including a resonance frequency and having a resonator impedance;

a discriminating bridge circuit being formed with the resonator as one arm and having first and second nodes; the bridge circuit responding to the resonator vibration frequencies to produce at the first node a first bridge signal with a phase and at the second node a second bridge signal with a phase shift with respect to the phase of the first bridge signal; the bridge circuit being so constructed and arranged that the phase shift leads or lags the phase of the first bridge signal by a first phase shift when the resonator is operating above or below its resonance frequency; the bridge circuit also having a bridge impedance at the first node, wherein the bridge impedance has the same characteristics as the resonator impedance when the resonator is operating as a freestanding device;

phase shifting circuitry for conditioning the second bridge signal so that the phase shift is further shifted by a second phase shift and producing an RF signal;

a synchronous demodulator stage for responding to both the first bridge and the RF signals and producing an error signal; the error signal having states respectively representing when the resonator is vibrating above, equal to and below its resonance frequency;

a control and oscillator stage having first, second and third terminals; the first terminal connected to receive a control signal derived from the error signal; the second terminal coupled to the resonator via the first node of the bridge circuit; the control and oscillator stage operating to produce the oscillator signal at the third terminal; the control and oscillator stage further being responsive to the states of the error signal so that when the resonator is initially vibrating above or below its resonance frequency the vibration frequency of the resonator will subsequently be reduced or increased respectively towards the resonance frequency; the vibration frequency of the resonator being unchanged when vibrating at its resonance frequency.

2. The oscillator circuit of claim 1 further comprising a second synchronous demodulator stage, an image resistor forming another arm of the bridge circuit, a voltage controlled (VC) resistance connected in series with the image resistor resulting in a combined resistance, and a ninety (90) degree phase shifting circuit coupled to receive the RF signal for producing a second RF signal having a ninety degree phase shift with respect to the RF signal; the second demodulator stage operating in quadrature and being responsive to the first bridge signal and the second RF signal for producing a second demodulator signal for changing the VC resistance so that the combined resistance of the VC resistance and the image resistor is equal to the ESR of the resonator.

3. The oscillator circuit of claim 1 wherein the demodulator stage further comprises a mixer having first and second input mixer terminals and an output mixer terminal, the first mixer input terminal being coupled to the first node, a fixed phase shifter having an output connected to the second input mixer terminal, and an integrator being connected to the output mixer terminal; the fixed phase shifter having an input connected to the second node; the mixer operating for producing a DC signal at the output mixer terminal; and the integrator being responsive to the DC signal to produce the control signal.

4. The oscillator circuit of claim 1 wherein the control and oscillator stage further includes a resonant series LC circuit coupled between the first and second terminals; the LC circuit having a variable reactance and being coupled to respond to the control signal for changing its reactance so that the vibration frequency of the resonator is returned to the resonance frequency whenever the resonator is not vibrating at its resonance frequency; the LC circuit maintaining its reactance whenever the resonator is vibrating at its resonance frequency.

5. The oscillator circuit of claim 4 wherein the LC circuit comprises a varactor diode, which is voltage controlled for changing its capacitance, and an inductor in series with the varactor diode.

6. The oscillator circuit of claim 4 further including an ALC (Automatic Level Control) circuit coupled to the bridge circuit and the control and oscillator stage for controlling a drive signal which is produced by the control and oscillator stage and which excites the resonator to vibrate.

7. The oscillator circuit of claim 6 wherein the ALC includes a capacitive voltage divider comprising 2 varactor diodes connected in series and having a combined series capacitance, each varactor diode being reverse biased and a tuning voltage applied for tuning each varactor diode in opposite directions with respect to one another so that the combined series capacitance remains constant.

8. The oscillator circuit of claim 7 further comprising an enhanced ALC where a capacitor having two ends is disposed such that one end is connected in series with an inductor which in turn is in series with a varactor diode; the other end of the capacitor being connected to the first node of the bridge so that the capacitor is located between the first node and the second terminal of the control and oscillator stage.

9. The oscillator circuit of claim 6 further comprising an enhanced ALC where a capacitor having two ends is disposed such that one end is connected in series with an inductor which in turn is in series with a varactor diode; the other end of the capacitor being connected to the first node of the bridge so that the capacitor is located between the first node and the second terminal of the control and oscillator stage.

10. The oscillator circuit of claim 1 further including an ALC (Automatic Level Control) circuit coupled to the bridge circuit and the control and oscillator stage for controlling a drive signal which is produced by the control and oscillator stage and which excites the resonator to vibrate.

11. The oscillator circuit of claim 10 wherein the ALC includes a capacitive voltage divider comprising 2 varactor diodes connected in series and having a combined series capacitance, each varactor diode being reverse biased and a tuning voltage applied for tuning each varactor diode in opposite directions with respect to one another so that the combined series capacitance remains constant.

12. The oscillator circuit of claim 11 further comprising an enhanced ALC where a capacitor having two ends is disposed such that one end is connected in series with an inductor which in turn is in series with a varactor diode; the other end of the capacitor being connected to the first node of the bridge so that the capacitor is located between the first node and the second terminal of the control and oscillator stage.

13. The oscillator circuit of claim 10 further comprising an enhanced ALC where a capacitor having two ends is disposed such that one end is connected in series with an inductor which in turn is in series with a varactor diode; the other end of the capacitor being connected to the first node of the bridge so that the capacitor is located between the first node and the second terminal of the control and oscillator stage.

14. The oscillator circuit of claim 1 wherein the bridge circuit is a half-lattice configuration comprising a center-tapped transformer, an image resistor, and the resonator each forming arms of the bridge circuit; wherein the resonator includes a crystal and an ESR (Equivalent Series Resistance); wherein the image resistor has a resistance equal to the ESR; wherein the first and second phase shifts are each ninety (90) degrees which results in the RF signal having a zero (0) phase shift with respect to the bridge signal when the vibration frequency of the resonator is below its resonance frequency, and which results in the RF signal having one hundred eighty (180) degrees phase shift with respect to the phase of the bridge signal when the vibration frequency of the resonator is above its resonance frequency.

15. The oscillator circuit of claim 14 further comprising a second synchronous demodulator stage, a voltage controlled (VC) resistance connected in series with the image resistor resulting in a combined resistance, and a ninety (90) degree phase shifting circuit coupled to receive the RF signal for producing a second RF signal having a ninety degree phase shift with respect to the RF signal; the second demodulator stage operating in quadrature and being responsive to the first bridge signal and the second RF signal for producing a second demodulator signal for changing the VC resistance so that the combined resistance of the VC resistance and the image resistor is equal to the ESR of the resonator.

16. The oscillator circuit of claim 14 further including an ALC (Automatic Level Control) circuit coupled to the bridge circuit and the control and oscillator stage for controlling a drive signal which is produced by the control and oscillator stage and which excites the resonator to vibrate.

17. The oscillator circuit of claim 16 wherein the ALC includes a capacitive voltage divider comprising 2 varactor diodes connected in series and having a combined series capacitance, each varactor diode being reverse biased and a tuning voltage applied for tuning each varactor diode in opposite directions with respect to one another so that the combined series capacitance remains constant.

18. The oscillator circuit of claim 17 further comprising an enhanced ALC where a capacitor having two ends is disposed such that one end is connected in series with an inductor which in turn is in series with a varactor diode; the other end of the capacitor being connected to the first node of the bridge so that the capacitor is located between the first node and the second terminal of the control and oscillator stage.

19. The oscillator circuit of claim 16 further comprising an enhanced ALC where a capacitor having two ends is disposed such that one end is connected in series with an inductor which in turn is in series with a varactor diode; the other end of the capacitor being connected to the first node of the bridge so that the capacitor is located between the first node and the second terminal of the control and oscillator stage.

20. The oscillator circuit of claim 14 wherein the control and oscillator stage further includes a resonant series LC circuit coupled between the first and second terminals; the LC circuit having a variable reactance and being coupled to respond to the control signal for changing its reactance so that the vibration frequency of the resonator is returned to the resonance frequency whenever the resonator is not vibrating at its resonance frequency; the LC circuit maintaining its reactance whenever the resonator is vibrating at its resonance frequency.

21. The oscillator circuit of claim 20 further comprising a second synchronous demodulator stage, a voltage controlled (VC) resistance connected in series with the image resistor resulting in a combined resistance, and a ninety (90) degree phase shifting circuit coupled to receive the RF signal for producing a second RF signal having a ninety degree phase shift with respect to the RF signal; the second demodulator stage operating in quadrature and being responsive to the first bridge signal and the second RF signal for producing a second demodulator signal for changing the VC resistance so that the combined resistance of the VC resistance and the image resistor is equal to the ESR of the resonator.

22. The oscillator circuit of claim 20 wherein the demodulator stage further comprises a mixer having first and second input mixer terminals and an output mixer terminal, the first mixer input terminal being coupled to the first node, a fixed phase shifter having an output connected to the second input mixer terminal, and an integrator being connected to the output mixer terminal; the fixed phase shifter having an input connected to the second node; the mixer operating for producing a DC signal at the output mixer terminal; and the integrator being responsive the the DC signal to produce the control signal.

23. The oscillator circuit of claim 20 wherein the LC circuit comprises a varactor diode, which is voltage controlled for changing its capacitance, and an inductor in series with the varactor diode.

24. The oscillator circuit of claim 20 further including an ALC (Automatic Level Control) circuit coupled to the bridge circuit and the control and oscillator stage for controlling a drive signal which is produced by the control and oscillator stage and which excites the resonator to vibrate.

25. The oscillator circuit of claim 24 wherein the ALC includes a capacitive voltage divider comprising 2 varactor diodes connected in series and having a combined series capacitance, each varactor diode being reverse biased and a tuning voltage applied for tuning each varactor diode in opposite directions with respect to one another so that the combined series capacitance remains constant.

26. The oscillator circuit of claim 25 further comprising an enhanced ALC where a capacitor having two ends is disposed such that one end is connected in series with an inductor which in turn is in series with a varactor diode; the other end of the capacitor being connected to the first node of the bridge so that the capacitor is located between the first node and the second terminal of the control and oscillator stage.

27. The oscillator circuit of claim 24 further comprising an enhanced ALC where a capacitor having two ends is disposed such that one end is connected in series with an inductor which in turn is in series with a varactor diode; the other end of the capacitor being connected to the first node of the bridge so that the capacitor is located between the first node and the second terminal of the control and oscillator stage.

28. The oscillator circuit of claim 1 wherein one arm of the bridge circuit between the first and second nodes comprises a precision phase inverter connected in series with an image resistor, and the second node is connected to a transconductance amplifier circuit.

29. The oscillator circuit of claim 28 further comprising a second synchronous demodulator stage, a voltage controlled (VC) resistance connected in series with the image resistor resulting in a combined resistance, and a ninety (90) degree phase shifting circuit coupled to receive the RF signal for producing a second RF signal having a ninety degree phase shift with respect to the RF signal; the second demodulator stage operating in quadrature and being responsive to the first bridge signal and the second RF signal for producing a second demodulator signal for changing the VC resistance so that the combined resistance of the VC resistance and the image resistor is equal to the ESR of the resonator.

30. The oscillator circuit of claim 28 further including an ALC (Automatic Level Control) circuit coupled to the bridge circuit and the control and oscillator stage for controlling a drive signal which is produced by the control and oscillator stage and which excites the resonator to vibrate.

31. The oscillator circuit of claim 30 wherein the ALC includes a capacitive voltage divider comprising 2 varactor diodes connected in series and having a combined series capacitance, each varactor diode being reverse biased and a tuning voltage applied for tuning each varactor diode in opposite directions with respect to one another so that the combined series capacitance remains constant.

32. The oscillator circuit of claim 31 further comprising an enhanced ALC where a capacitor having two ends is disposed such that one end is connected in series with an inductor which in turn is in series with a varactor diode; the other end of the capacitor being connected to the first node of the bridge so that the capacitor is located between the first node and the second terminal of the control and oscillator stage.

33. The oscillator circuit of claim 30 further comprising an enhanced ALC where a capacitor having two ends is disposed such that one end is connected in series with an inductor which in turn is in series with a varactor diode; the other end of the capacitor being connected to the first node of the bridge so that the capacitor is located between the first node and the second terminal of the control and oscillator stage.

34. The oscillator circuit of claim 28 wherein the precision phase inverter comprises an input, an output, an adjustable phase equalizer connected between the input and a non-precision inverter, the non-precision inverter connected between the phase equalizer and the output, a half-bridge circuit connected between the input and a third synchronous demodulator, the third synchronous demodulator connected between an error integrator and the half-bridge circuit, the error integrator connected between the third synchronous demodulator and the phase equalizer, and the half bridge circuit also connected between the output and the third synchronous demodulator.

35. The oscillator circuit of claim 34 wherein the control and oscillator stage further includes a resonant series LC circuit coupled between the first and second terminals; the LC circuit having a variable reactance and being coupled to respond to the control signal for changing its reactance so that the vibration frequency of the resonator is returned to the resonance frequency whenever the resonator is not vibrating at its resonance frequency; the LC circuit maintaining its reactance whenever the resonator is vibrating at its resonance frequency.

36. The oscillator circuit of claim 35 wherein the LC circuit comprises a varactor diode, which is voltage controlled for changing its capacitance, and an inductor in series with the varactor diode.

37. The oscillator circuit of claim 35 further including an ALC (Automatic Level Control) circuit coupled to the bridge circuit and the control and oscillator stage for controlling a drive signal which is produced by the control and oscillator stage and which excites the resonator to vibrate.

38. The oscillator circuit of claim 37 wherein the ALC includes a capacitive voltage divider comprising 2 varactor diodes connected in series and having a combined series capacitance, each varactor diode being reverse biased and a tuning voltage applied for tuning each varactor diode in opposite directions with respect to one another so that the combined series capacitance remains constant.

39. The oscillator circuit of claim 38 further comprising an enhanced ALC where a capacitor having two ends is disposed such that one end is connected in series with an inductor which in turn is in series with a varactor diode; the other end of the capacitor being connected to the first node of the bridge so that the capacitor is located between the first node and the second terminal of the control and oscillator stage.

40. The oscillator circuit of claim 37 further comprising an enhanced ALC where a capacitor having two ends is disposed such that one end is connected in series with an inductor which in turn is in series with a varactor diode; the other end of the capacitor being connected to the first node of the bridge so that the capacitor is located between the first node and the second terminal of the control and oscillator stage.

41. The oscillator circuit of claim 28 wherein the control and oscillator stage further includes a resonant series LC circuit coupled between the first and second terminals; the LC circuit having a variable reactance and being coupled to respond to the control signal for changing its reactance so that the vibration frequency of the resonator is returned to the resonance frequency whenever the resonator is not vibrating at its resonance frequency; the LC circuit maintaining its reactance whenever the resonator is vibrating at its resonance frequency.

42. The oscillator circuit of claim 41 wherein the LC circuit comprises a varactor diode, which is voltage controlled for changing its capacitance, and an inductor in series with the varactor diode.

43. The oscillator circuit of claim 41 further including an ALC (Automatic Level Control) circuit coupled to the bridge circuit and the control and oscillator stage for controlling a drive signal which is produced by the control and oscillator stage and which excites the resonator to vibrate.

44. The oscillator circuit of claim 43 wherein the ALC includes a capacitive voltage divider comprising 2 varactor diodes connected in series and having a combined series capacitance, each varactor diode being reverse biased and a tuning voltage applied for tuning each varactor diode in opposite directions with respect to one another so that the combined series capacitance remains constant.

45. The oscillator circuit of claim 44 further comprising an enhanced ALC where a capacitor having two ends is disposed such that one end is connected in series with an inductor which in turn is in series with a varactor diode; the other end of the capacitor being connected to the first node of the bridge so that the capacitor is located between the first node and the second terminal of the control and oscillator stage.

46. The oscillator circuit of claim 43 further comprising an enhanced ALC where a capacitor having two ends is disposed such that one end is connected in series with an inductor which in turn is in series with a varactor diode; the other end of the capacitor being connected to the first node of the bridge so that the capacitor is located between the first node and the second terminal of the control and oscillator stage.

47. Method for stabilizing an oscillator signal generated from an oscillator circuit comprising the steps of:

operating a resonator at variable vibration frequencies including a resonance frequency;

connecting the resonator to form one arm of a discriminating bridge circuit, wherein the resonator when free standing outside the bridge circuit has impedance characteristics dependent upon its vibration frequency; and the bridge circuit has an impedance;

arranging the bridge circuit so that its impedance at a first node of the bridge circuit has the same impedance characteristics as the free standing resonator;

producing at the first node of the bridge circuit a first bridge signal having a phase;

producing at a second node of the bridge circuit a second bridge signal having a phase shift which leads or lags the phase of the first bridge signal by a first prescribed phase shift when the resonator is vibrating respectively above or below its resonance frequency;

phase shifting the second bridge signal by a second prescribed phase shift and generating an RF signal;

mixing the first bridge and the RF signals in a synchronous demodulator stage and generating an error signal having states representing when the resonator is vibrating above, equal to and below its resonance frequency;

converting the error signal to a control signal and transmitting the control signal to an oscillator stage having first, second, and third terminals;

operating the oscillator stage to respond to the states of the control signal being applied to the first terminal so that when the resonator is initially vibrating above, equal to, or below its resonance frequency the vibrating frequency of the resonator will subsequently be reduced, kept unchanged, or increased respectively towards the resonance frequency;

connecting the second terminal to the first node; and operating the oscillator stage to respond to the resonator for generating the oscillator signal at the third terminal.

48. The method of claim 47 including the steps of providing an image resistor as another arm of the bridge circuit; connecting a voltage controlled (VC) resistance in series with the image resistor and resulting in a combined resistance; connecting a ninety (90) degree phase shifting circuit to receive the RF signal for generating a second RF signal having a ninety (90) degree phase shift with respect to the RF signal; transmitting the first bridge signal and the second RF signal to a second synchronous demodulator stage; operating the second synchronous demodulator stage in quadrature for producing a second demodulator signal; and responding to the second demodulator signal and changing the VC resistance so that the combined resistance is equal to the ESR of the resonator.

49. The method of claim 47 further comprising the steps of including in the demodulator a mixer having first and second input mixer terminals and an output mixer terminal; connecting the first node to the first input mixer terminal; connecting an output of a fixed phase shifter to the second input mixer terminal; connecting an integrator to the output mixer terminal; connecting an input of the fixed phase shifter to the second node; operating the mixer for producing a DC signal at the output mixer terminal; and operating the integrator to respond to the DC signal for generating the control signal.

50. The method of claim 47 further comprising the steps of including in the oscillator stage a resonant series LC circuit having a variable reactance; coupling the LC circuit between the first and second terminals; responding to the control signal by changing the variable reactance so that the vibration frequency of the resonator is returned to the resonance frequency whenever the resonator is not vibrating at its resonance frequency; and maintaining the reactance unchanged whenever the resonator is vibrating at its resonance frequency.

51. The method of claim 50 further comprising the steps of including in the LC circuit a varactor diode having a voltage controlled capacitance and an inductor; connecting the diode and inductor in series; and operating the diode for responding to the control signal.

52. The method of claim 51 including the steps of connecting an ALC (Automatic Level Control) circuit to the bridge circuit and the oscillator stage for controlling a drive signal produced by the oscillator stage; and transmitting the drive signal to the resonator for exciting it to vibrate.

53. The method of claim 52 including the step of connecting a capacitor between the second terminal and the first node so as to produce an enhanced ALC circuit.

54. The method of claim 47 including the steps of connecting an ALC (Automatic Level Control) circuit to the bridge circuit and the oscillator stage for controlling a drive signal produced by the oscillator stage; and transmitting the drive signal to the resonator for exciting it to vibrate.

55. The method of claim 54 including the steps of connecting one end of a capacitor to on end of an inductor; connecting the other end of the inductor in series with a varactor diode; connecting the other end of the capacitor to the first node so that capacitor is located between the first node and the second terminal of the oscillator stage.

56. The method of claim 54 including the steps of providing a capacitive voltage divider in the ALC circuit comprising two varactor diodes connected in series and having a combined capacitance; reverse biasing each diode; tuning each diode in opposite directions with respect to one another with a tuning voltage so that the combined series capacitance remains constant.

57. The method of claim 47 including the steps of connecting between the first and second nodes a precision phase inverter in series with an image resistor; and connecting a transconductance amplifier circuit to the second node.

58. The method of claim 57 further comprising the steps of connecting an adjustable phase equalizer between an input of the precision phase inverter and a non-precision inverter; connecting the non-precision inverter between the phase equalizer and an output of the precision phase inverter; connecting a half-bridge circuit between the input and a third synchronous demodulator; connecting the third synchronous demodulator between an error integrator and the half-bridge circuit; connecting the error integrator between the third synchronous demodulator and the phase equalizer; and connecting the half-bridge circuit between the output and the third synchronous demodulator.

59. The method of claim 58 further comprising the steps of including in the oscillator stage a resonant series LC circuit having a variable reactance; coupling the LC circuit between the first and second terminals; responding to the control signal by changing the variable reactance so that the vibration frequency of the resonator is returned to the resonance frequency whenever the resonator is not vibrating at its resonance frequency; and maintaining the reactance unchanged whenever the resonator is vibrating at its resonance frequency.

60. The method of claim 47 further comprising the steps of configuring the bridge circuit as a half-lattice wherein a center-tapped transformer, an image resistor, and the resonator each form arms of the bridge circuit; configuring the resonator as a crystal having and ESR (Equivalent Series Resistance); providing the image resistor with a resistance equal to the ESR; making the first and second prescribed phase shifts to be each equal to ninety (90) degrees resulting in the RF signal having a zero (0) phase shift with respect to the bridge signal when the vibration frequency of the resonator is below its resonance frequency, and which results in the RF signal having one hundred eighty (180) degrees phase shift with respect to the phase of the bridge signal when the vibration frequency of the resonator is above its resonance frequency.

61. The method of claim 60 including the steps of connecting a voltage controlled (VC) resistance in series with the image resistor and resulting in a combined resistance; connecting a ninety (90) degree phase shifting circuit to receive the RF signal for generating a second RF signal having a ninety (90) degree phase shift with respect to the RF signal; transmitting the first bridge signal and the second RF signal to a second synchronous demodulator stage; operating the second synchronous demodulator stage in quadrature for producing a second demodulator signal; and responding to the second demodulator signal and changing the VC resistance so that the combined resistance is equal to the ESR of the resonator.

62. The method of claim 61 further comprising the steps of including in the oscillator stage a resonant series LC circuit having a variable reactance; coupling the LC circuit between the first and second terminals; responding to the control signal by changing the variable reactance so that the vibration frequency of the resonator is returned to the resonance frequency whenever the resonator is not vibrating at its resonance frequency; and maintaining the reactance unchanged whenever the resonator is vibrating at its resonance frequency.

63. The method of claim 62 including the steps configuring the LC circuit as varactor diode, which is voltage controlled for changing its capacitance; connecting an inductor in series with the varactor diode.

64. The method of claim 62 including the steps of connecting an ALC (Automatic Level Control) circuit to the bridge circuit and the oscillator stage for controlling a drive signal produced by the oscillator stage; and transmitting the drive signal to the resonator for exciting it to vibrate.

65. The method of claim 64 including the steps of connecting a capacitor between the second terminal and the first node so as to produce an enhanced ALC circuit.

66. The method of claim 64 including the steps of providing a capacitive voltage divider in the ALC circuit comprising two varactor diodes connected in series and having a combined capacitance; reverse biasing each diode; tuning each diode in opposite directions with respect to one another with a tuning voltage so that the combined series capacitance remains constant.

67. An oscillator comprising:
a resonator having an Equivalent Series Resistance (ESR) and a resonant frequency that is a function of an excitation current;
a circuit for generating a programmable negative resistance;
a resonant series LC circuit having inductive and capacitive elements and a voltage appearing at a terminal located between the inductive and capacitive elements;
a voltage detector connected to the terminal and used to program the value of the negative resistance to be equal to the ESR, such that the negative resistance produces a fixed value of the voltage at the terminal resulting in a desired value of current for exciting the resonator.

68. The oscillator of claim 67 wherein the circuit for generating further includes a gain control stage comprising two varactor diodes connected in series; wherein the two diodes have a combined series capacitance with each diode being reverse biased and a tuning voltage is applied for tuning each diode in opposite directions with one another so that the combined series capacitance remains constant.

69. The oscillator of claim 68 wherein the voltage detector includes a diode.

70. The oscillator of claim 69 wherein the resonator includes a crystal.

71. Method for stabilizing an oscillator signal produced by an oscillator circuit comprising the steps of:
exciting a resonator into resonant frequency via the application of an excitation current; the resonator having an Equivalent Series Resistance (ESR);
generating a programmable negative resistance;
configuring a resonant series LC circuit with inductive and capacitive elements and generating a voltage at a terminal located between the inductive and capacitive elements;
responding to the voltage for programming the value of the negative resistance to be equal to the ESR such that the negative resistance produces a fixed value of the voltage at the terminal resulting in a desired value of current for exciting the resonator.

72. The method of claim 71 wherein the step of generating a resistance includes connecting two varactor diodes in series with a combined series capacitance; reverse biasing each diode with a tuning voltage applied to each diode in opposite directions with one another so that the combined series capacitance remains constant.

73. The method of claim 72 including the step of using a diode in the step of responding.

74. The method of claim 73 including the step of configuring the resonator to include a crystal.

* * * * *